United States Patent [19]

Baker et al.

[11] Patent Number: 4,853,346
[45] Date of Patent: Aug. 1, 1989

[54] OHMIC CONTACTS FOR SEMICONDUCTOR DEVICES AND METHOD FOR FORMING OHMIC CONTACTS

[75] Inventors: John M. Baker; Alessandro C. Callegari, both of Yorktown Heights; Dianne L. Lacey, Mahopac, all of N.Y.; Yih-Cheng Shih, Middletown, N.J.

[73] Assignee: International Business Machines Corporation, Armonk, N.Y.

[21] Appl. No.: 140,072

[22] Filed: Dec. 31, 1987

[51] Int. Cl.$^4$ .................... H01L 21/44; H01L 21/465
[52] U.S. Cl. .................... 437/184; 437/189; 437/202; 437/246
[58] Field of Search ................ 437/184, 189, 202, 246

[56] References Cited

U.S. PATENT DOCUMENTS

| | | | |
|---|---|---|---|
| 3,386,867 | 6/1968 | Staples | 437/189 |
| 3,850,688 | 11/1974 | Halt . | |
| 3,914,785 | 10/1975 | Ketchow . | |
| 3,959,522 | 5/1976 | Ladany et al. . | |
| 4,179,534 | 12/1979 | Chang et al. . | |
| 4,186,410 | 1/1980 | Cho et al. . | |
| 4,188,710 | 2/1980 | Davey et al. . | |
| 4,301,188 | 11/1981 | Niehaus | 437/184 |
| 4,454,528 | 6/1984 | Trueblood . | |
| 4,471,005 | 9/1984 | Cheng et al. | 437/184 |
| 4,510,514 | 4/1985 | Camlibel et al. . | |

FOREIGN PATENT DOCUMENTS 55-80366 6/1980 Japan .

OTHER PUBLICATIONS

Gupta et al, Metallization Systems for Ohmic Contacts to p- and n-type GaAs, Int. J. Electronics, 1979, vol. 47, No. 5, 459-467.

Piotrowska et al, Ohmic Contacts to III-V Compound Semiconductors: A Review of Fabrication Techniques, Solid-State Electronics, vol. 26, No. 3, pp. 179-197, 1983.

K. Heime et al., Very Low Resistance Ni-AuGe-Ni Contacts to n-GaAs, Solid State Electronics, 1974, vol. 17, pp. 835-837.

A. Callegari et al., Uniform and Thermally Stable AuGeNi Ohmic Contacts to GaAs, Appl. Phys. Lett. 46(12), Jun. 1985, pp. 1141-1143.

Masanori Murakami et al., Microstructure Studies of AuNiGe Ohmic Contacts to n-type GaAs, J. Vac. Sci. Technol., B 4(4), Jul./Aug. 1986, pp. 903-911.

Primary Examiner—Donald L. Walton
Attorney, Agent, or Firm—Scully, Scott, Murphy & Presser

[57] ABSTRACT

A method for forming an ohmic contact on a GaAs semiconductor material comprising depositing a non-uniform layer of Au onto the surface layer of the semiconductor material, depositing a multi-layer ohmic contact of AuGeNi onto the non-uniform layer and alloying the ohmic contact to the semiconductor material. The non-uniform Au layer may be deposited by backscattering Au during sputter cleaning of the semiconductor surface wherein the electrode is coated with Au. After alloying, the ohmic contact comprises a two layer structure having a high density of large area NiAs(Ge) grains contacting the semiconductor material as the first layer and an AuGa phase as the top layer. The ohmic contact has reduced contact resistance and exhibits a reduction in the spread of contact resistance after high temperature annealing.

27 Claims, 3 Drawing Sheets

OHMIC CONTACTS FOR SEMICONDUCTOR DEVICES AND METHOD FOR FORMING OHMIC CONTACTS

BACKGROUND OF THE INVENTION

1. Field of the Invention

This invention is directed to ohmic contacts for semiconductor devices and more particularly, to an ohmic contact of the AuGeNi system onto a GaAs substrate.

2. Description of the Prior Art

Interest in developing GaAs based semiconductor devices such as high speed low power field effect transistors, has been increasing in recent years. One of the important requirements necessary in developing these devices is the fabrication of low resistance and thermally stable ohmic contacts with uniform interfaces. The AuNiGe system has been extensively used as the ohmic contact to GaAs materials that yield reproducible contacts with low contact sensitivity. However, the spread of the resistance values of an ohmic contact is usually large which could seriously limit the device performance.

The spread of contact resistance is believed to be closely related to the non-uniform microstructure at the interface. Ge containing protrusions, which are believed to be the paths of major current flow, are generally formed after contact alloying and cause a rough interface. Large spread of the contact resistance is probably due to such interface complexity, especially if the non-uniformed distribution is near the contact edges where current crowding is most important. Improved uniformity of the interfacial microstructure of the contacts is expected to reduce the spread of contact resistance.

Thermal instability is another major concern for the AuNiGe ohmic contacts. After formation, the contacts are required to retain their properties after high temperature cycling required to complete the device and circuit fabrication. Poor thermal stability of the contact materials results in a spread of the contact resistance due to a deterioration of the microstructure required for low contact resistance and optimum device performance.

Improved uniformity of the ohmic contact has been reported when a sputter cleaning of the GaAs substrate was done before the deposition of the metals. A. Callegari, et al., Appl. Phys. Lett. 46, 1141 (1985). In addition, the deposition of a 5 nm of Ni as a first layer of AuNiGe ohmic contacts significantly reduces the spread of the contact resistance as well as the mean value of contact resistance as explained by M. Murakami, et al., J. Vac. Sci. Technol. B4, 903 (1986).

One method of counteracting the problem of non-uniformity in the metal GaAs interface is shown in U.S. Pat. No. 3,959,522 in which a layer of gold is deposited onto a heated semiconductor body, depositing tin onto the cooled body and then alloying the two layers to the semiconductor material. The tin uniformly alloys itself to the gold layer and penetrates into the semiconductor material to form a uniform contact with the semiconductor material which reduces the problem of the tin balling up on the surface. The deposition of an initial layer of gold onto a GaAs semiconductor material is also shown in U.S. Pat. No. 4,179,534 in which initial layers of gold and tin are deposited at temperatures below 200° C. and then alloyed to the semiconductor material which results in the ohmic contacts having high peel strength. None of the above methods obviate the problem of the spread of contact resistance after high temperature annealing.

SUMMARY OF THE INVENTION

The present invention is directed to a method for forming an ohmic contact on a semiconductor material containing GaAs comprising the steps of depositing a non-uniform layer of Au onto the GaAs surface layer of the semiconductor material, depositing a multi-layer ohmic contact of AuGeNi onto the non-uniform Au layer and alloying the ohmic contact to the semiconductor material. In one embodiment, the non-uniform layer of Au is deposited simultaneously with the sputter cleaning of the GaAs surface layer by utilizing a Au-coated rf-electrode in the sputter cleaning process. In this embodiment, the Au is sputtered off the electrode and is back-scattered from Ar atoms to the GaAs surface. The back-scattered Au atoms migrate on the surface of the semiconductor wafer to form islands or at least a non-uniform layer. In another embodiment, the GaAs surface layer is sputter cleaned using a rf or dc glow discharge process and simultaneously the Au is evaporated or sputtered onto the semiconductor material to form the non-uniform layer of Au. The method of the present invention may also be carried out by first sputter cleaning the surface layer of the GaAs substrate and subsequently depositing the non-uniform layer of Au by evaporation.

Typically, the ohmic contact is formed onto the non-uniform layer of Au by depositing an initial thin layer of Ni onto the non-uniform layer followed by a layer of AuGe onto the Ni layer, a layer of Ni is then deposited onto the AuGe layer followed by a layer of Au deposited onto the Ni layer. After alloying at a temperature between 400° to 550° C., an ohmic contact is formed that comprises a two layer structure having a high density of large area NiAs(Ge) grains contacting the semiconductor material as the first layer and an AuGa phase as the top layer. The large area grains are on the order of approximately 300 nm and provide a significant increase in a good ohmic contact area than that shown in any prior art devices. The spread in contact resistance observed with the ohmic contact made in accordance with the present method has been significantly reduced under high temperature anneal.

DETAILED DESCRIPTION OF THE PREFERRED EMBODIMENTS

In accordance with the method of the present invention, an ohmic contact is formed on a GaAs semiconductor material that exhibits a significant reduction in the contact resistance after alloying and a significant reduction in the spread of contact resistance after high temperature annealing. The improved ohmic contact consists of the AuGeNi system contacts to semiconductor devices having GaAs as the surface layer. The invention is also useful on surface layers containing GaAs such as GaAlAs and other compounds. The method for forming the ohmic contact on the semiconductor material containing GaAs comprises the steps of depositing a non-uniform layer of Au onto one surface of the semiconductor material, depositing the multilayer ohmic contact of AuGeNi onto the non-uniform Au layer and alloying the ohmic contact to the semiconductor material.

Figure 1:
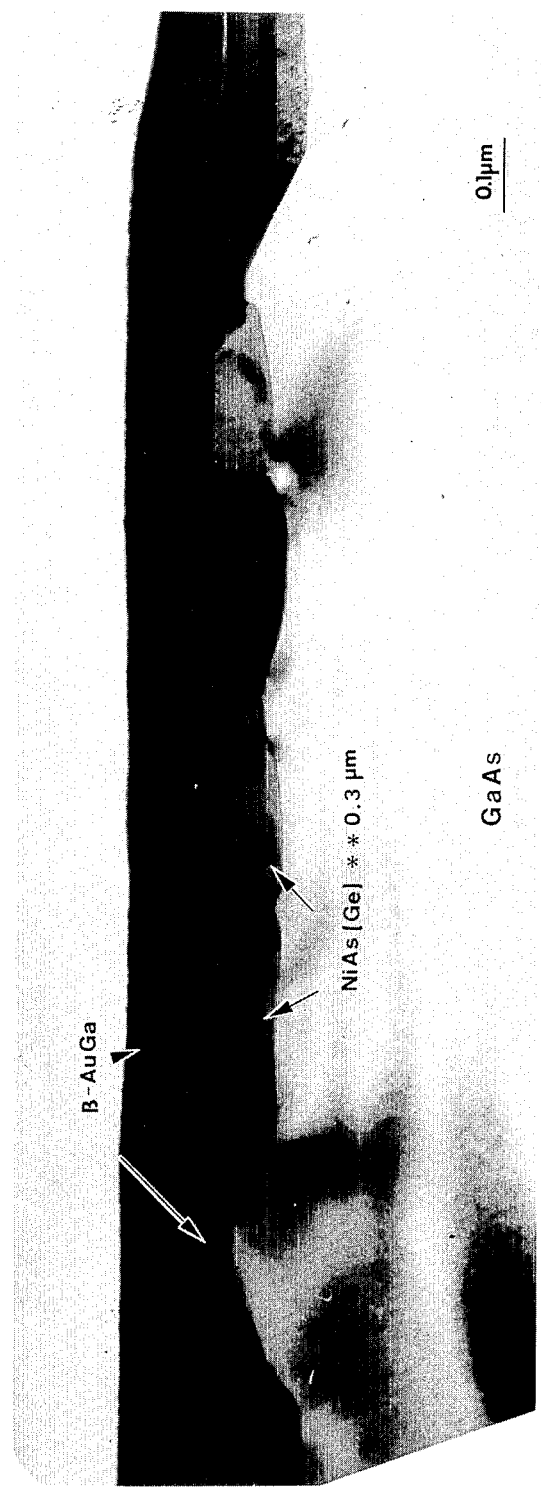
FIG. 1 is a cross-sectional transmission electron microscopy of the ohmic contact formed on the semiconductor material in accordance with the present invention.
Figure 2:
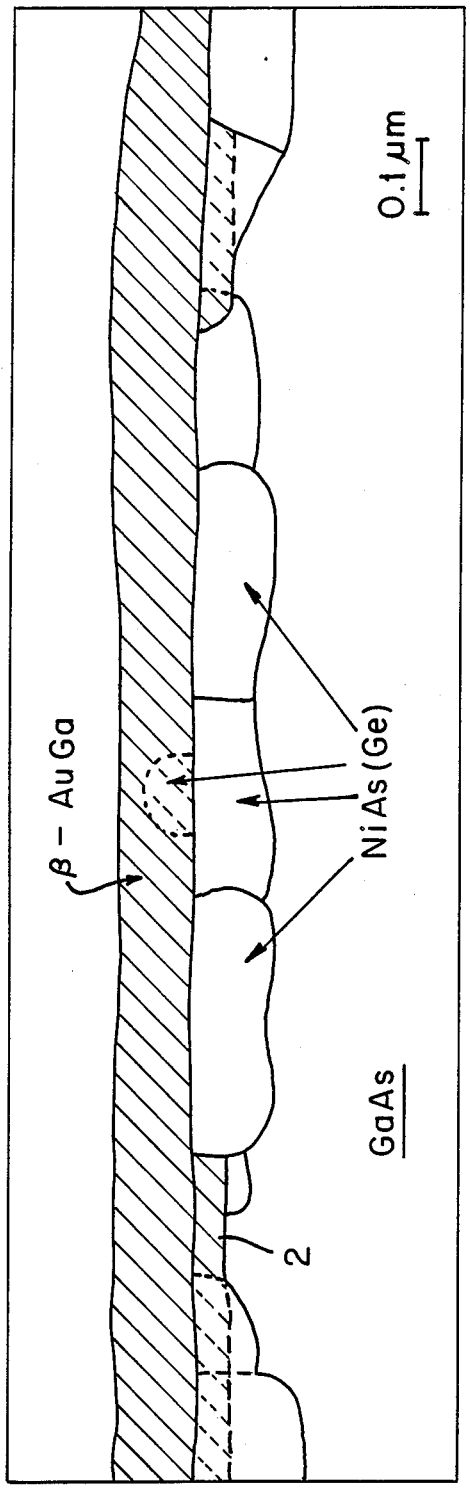
FIG. 2 is a schematic diagram of the phases observed in the TEM picture of FIG. 1.

After alloying, the ohmic contact comprises a two layer structure having a high density of large area NiAs(Ge) grains contacting the semiconductor material as a first layer and an AuGa phase as a top layer. FIG. 1 is a cross-sectional transmission electron microscopy that was used to explore the interface between the GaAs substrate and the alloyed ohmic contact of the present invention. The relationship between the phases of the ohmic contact may be better understood by looking at the schematic diagram of the phases shown in FIG. 2. As shown in FIG. 2, the unhatched areas above the GaAs substrate are grains of NiAs(Ge) the majority of which are large area grains, in order of 300 nm. The top hatched layer is AuGa which has been determined to be $\beta$-AuGa. As can be seen, the interface between the GaAs material and the first layer of the ohmic contact is relatively smooth with only a very small area indicated at 2 of AuGa contacting the GaAs. The inventors believe that the significant improvement in the thermal stability of the ohmic contact is due to the large area of the NiAs(Ge) grains contacting the GaAs surface. It is further believed that the thermal instabilities of the AuGeNi ohmic contacts are due to the AuGa grain growth at the GaAs interface. The increase in the grain size of the NiAs(Ge) grains at this interface inhibits the amount of AuGa growth at the interface, thus providing the improved thermal stability.

The deposition of a non-uniform layer of Au onto the surface of the semiconductor material may be accomplished by any known manner. In a preferred embodiment, the Au is deposited simultaneously with the sputter cleaning of the semiconductor material prior to the deposition of the AuGeNi phases. Sputter cleaning has been determined to improve the resistance spread and thermal stability of AuGeNi contacts to GaAs. In one method, the sputter cleaning is performed in a rf glow discharge process wherein the sputter electrode is coated with Au. The wafer having a GaAs surface is mounted on an Au coated rf electrode and the sputter cleaning process is performed at a Ar pressure of 10 mTorr or greater. During the sputtering process, Au sputtered from the Au-coated electrode collides with the Ar molecules and are back-scattered to the surface of the GaAs wafer. The back-scattered Au atoms migrate on the surface of the wafer to form islands or at least a non-uniform layer of Au. The presence of this Au layer affects the structure of the subsequently deposited alloy film in a manner such that the contact resistance becomes quite uniform. The simultaneous sputter cleaning and deposition of the non-uniform Au layer is believed to enhance the improvements realized in the structure of the ohmic contact after alloying.

Figure 3:
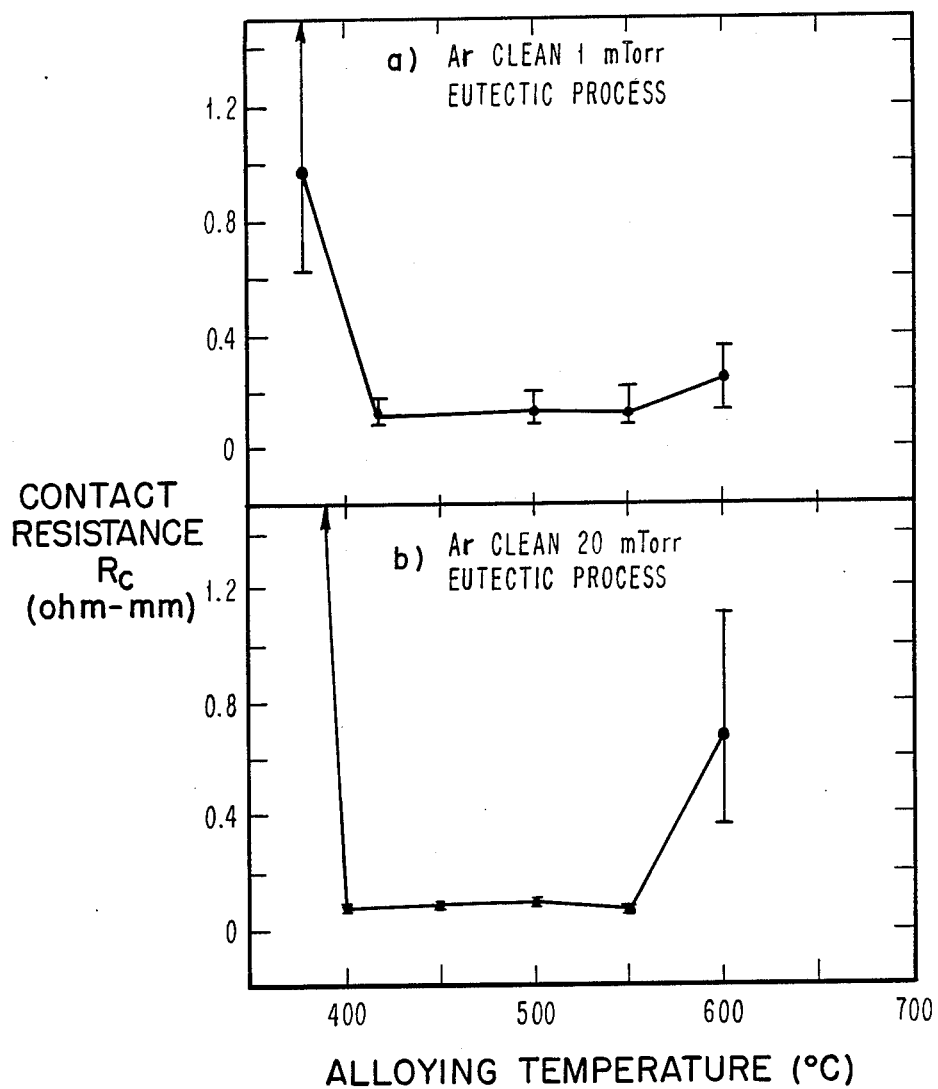
FIG. 3 are graphs of the contact resistance plotted as a function of alloying temperature for samples fabricated at different sputter cleaning pressures.

The improvements in the contact resistance can be shown in FIG. 3. Graphs (a) and (b) represent the contact resistances of GaAs semiconductor wafers measured by TLM after alloying at temperatures in the range from 400° to 600° C. for approximately two minutes. The circles correspond to the average contact resistance values at the alloying temperature and the error bars extending from the circles represent the maximum and minimum valves of the measured contact resistance. In Graph (a), the contact resistance was 0.11 ohm-mm after alloying at a temperature of 420° C. The spread of contact resistance was found to be 0.03 ohm-mm. The wafers observed in Graph (a) were cleaned in a sputtering atmosphere of 1 mTorr. Graph (b) shows the contact resistance to be 0.08 ohm-mm and the resistance spread, being almost unobservable, of 0.01 ohm-mm in the 150° C. range between 400° and 550° C. Both Graphs (a) and (b) show a marked increase in the spread with an alloying temperature of 600° C. Thus, it is preferred that the sputter cleaning process be performed at a pressure of at least 10 mTorr and that alloying be done at temperatures between 400°–550° C. It is believed that backscattering under these pressures will be sufficient to stop the atoms sputtered from the rf-electrode in the vicinity of electrode. At low pressures, the atoms escape from the region of the cathode and only a small fraction are returned such that the islands formed are fewer in number and/or size than that observed utilizing the higher pressures.

The thickness of the islands of Au deposited onto the GaAs semiconductor material is approximately between 10 and 30 angstroms. While the backscattering method described above is a preferred method, it may also be possible to simultaneously sputter clean the surface and evaporate or sputter deposit Au onto the surface from a remote source. The wafers would be cleaned by sputtering at 4 mTorr of $O_2$ with 100-Vdc bias for five minutes and then in 1 mTorr of Ar with 250-Vdc bias for ten minutes. The Au metal would be simultaneously evaporated from heated crucibles or sputtered from a remote target. Alternatively, the wafers could first be sputter cleaned and subsequent to the sputter cleaning the Au would be deposited to form the non-uniform layer. In this process, for example, the semiconductor wafer would be first sputter cleaned at 4 mTorr with 100-Vdc bias for five minutes in $O_2$ followed by etching with Ar gas at 1 mTorr at 250-Vdc bias for ten minutes. Subsequently, the Au would be evaporated from heated crucibles with the base pressure of approximately $2 \times 10^{-7}$ Torr. In addition, the sputter cleaning may be performed by ion bombardment with an ion gun simultaneous with the deposition of the Au.

Forming of the ohmic contacts to the semiconductor GaAs material would be performed by depositing a layer of approximately 50 angstroms of Ni onto the non-uniform Au layer. Next, approximately 1,000 angstroms of AuGe would be deposited onto the Ni layer and approximately 300 angstroms of Ni on top of the AuGe layer. Finally, another layer of Au between 500 and 1,000 angstoms would be deposited onto the Ni layer. The ohmic contact would then be alloyed to the semiconductor material using an alloying temperature between 400° C. and 550° C. for approximately two minutes. The devices, after alloying, are finally fabricated by utilizing a high temperature stress anneal wherein the structure is heated at approximately 400° C. for anywhere from 2 to 10 hours. After annealing, the wafer of Graph (b) of FIG. 3 showed a change in contact resistance from 0.11 ohm-mm to 0.22 ohm-mm. Wafers that were alloyed and annealed not having the non-uniform Au layer showed an increase of the contact resistance from 0.13 ohm-mm to 0.42 ohms-mm Thus, a significant improvement in the reduction of both contact resistance and spread is observed with the process of the present invention under high temperature annealing.

While illustrative embodiments of the subject invention have been described and illustrated, it is obvious that various changes and modifications can be made therein without departing from the spirit of the present invention which should be limited only by the scope of the appended claims.

We claim:

1. A method of forming an ohmic contact on a semiconductor material containing GaAs comprising the steps of:
   (a) depositing a non-uniform layer of Au onto one surface of the semiconductor material by sputter cleaning the semiconductor by using an Au-coated rf-electrode;
   (b) depositing a multi-layer ohmic contact of AuGeNi onto the non-uniform Au layer; and
   (c) alloying the ohmic contact to the semiconductor material.

2. The method of claim 1 wherein the sputter cleaning is performed at a pressure of at least 10 mTorr.

3. The method of claim 2 wherein the sputter cleaning is performed at a pressure of 20 mTorr utilizing Ar gas.

4. The method of claim 1 wherein the multi-layer ohmic contact is deposited by:
   (a) depositing a layer of approximately 50 angstroms of Ni into the non-uniform layer of Au;
   (b) depositing a layer of approximately 1,000 angstroms of AuGe onto the Ni;
   (c) depositing a layer of approximately 300 angstroms of Ni onto the AuGe layer; and
   (d) depositing a layer of between 500 to 1000 angstroms of Au onto the Ni layer.

5. The method of claim 4 wherein the ohmic contact after alloying comprises a two layer structure having a high density of large area NiAs(Ge) grains contacting the semiconductor material as a first layer and a AuGa phase as a top layer.

6. The method of claim 5 wherein the large area NiAs(Ge) grains contacting the semiconductor material are approximately 300 nm wide.

7. The method of claim 1 wherein the sputter cleaning is performed by a d.c. glow discharge process.

8. The method of claim 1 wherein the alloying step is performed at a temperature in the range between 400° C. to 550° C.

9. The method of claim 8 further including a step of annealing the semiconductor material subsequent to the alloying step at a temperature in the range between 350° C.–450° C. for a time period between 2 hours to 10 hours.

10. The method of claim 1 wherein the semiconductor material is GaAlAs.

11. A method of forming an ohmic contact on a semiconductor material containing GaAs comprising the steps of:
   (a) simultaneously cleaning one surface of the semiconductor material and depositing a non-uniform layer of Au onto the surface of the semiconductor material being cleaned;
   (b) depositing a multi-layer ohmic contact of Ni/AuGe/Ni/Au onto the surface of the semiconductor material having the non-uniform layer of Au thereon; and
   (c) alloying the ohmic contact to the semiconductor material.

12. The method of claim 11 wherein the simultaneous cleaning and depositing of the Au is performed by sputter cleaning the semiconductor material surface utilizing an Au-coated rf-electrode.

13. The method of claim 12 wherein the ohmic contact after alloying comprises a two layer structure having a high density of large area NiAs(Ge) grains contacting the semiconductor material as a first layer and a AuGa phase as a top layer.

14. The method of claim 13 wherein the large area NiAs(Ge) grains contacting the semiconductor material are approximately 300 nm wide.

15. The method of claim 11 wherein the simultaneous cleaning and depositing of the Au is performed by sputter cleaning the semiconductor material and evaporating Au onto the semiconductor material.

16. The method of claim 15 wherein the sputter cleaning is performed by ion bombardment with an ion gun.

17. The method of claim 15 wherein the sputter cleaning is performed by a d.c. glow discharge process.

18. The method of claim 15 wherein the ohmic contact after alloying comprises a two layer structure having a high density of large area NiAs(Ge) grains contacting the semiconductor material as a first layer and a AuGa phase as a top layer.

19. The method of claim 18 wherein the large area NiAs(Ge) grains contacting the semiconductor material are approximately 300 nm wide.

20. The method of claim 11 wherein the simultaneous cleaning and depositing of the Au is performed by sputter cleaning the semiconductor material and sputtering Au from a separate target onto the semiconductor material.

21. A method of forming an ohmic contact on a semiconductor material containing GaAs comprising the steps of:
   (a) sputter cleaning one surface of the semiconductor material;
   (b) depositing a non-uniform layer of Au on the cleaned semiconductor material surface;
   (c) depositing a multi-layer ohmic contact of AuGeNi onto the non-uniform Au layer; and
   (d) alloying the ohmic contact to the semiconductor material thereby forming a two layer contact having a first layer containing a high density of large area grains contacting said semiconductor material.

22. The method of claim 21 wherein the multi-layer ohmic contact is deposited by:
   (a) depositing a layer of approximately 50 angstroms of Ni onto the non-uniform layer of Au;
   (b) depositing a layer of approximately 1,000 angstroms of AuGe onto the Ni layer;
   (c) depositing a layer of approximately 300 angstroms of Ni onto the AuGe layer; and
   (d) depositing a layer of between 500 to 1000 angstroms of Au onto the Ni layer.

23. The method of claim 22 wherein the ohmic contact after alloying comprises a two layer structure having a high density of large area NiAs(Ge) grains contacting the semiconductor material as a first layer and a AuGa phase as a top layer.

24. The method of claim 23 wherein the large area NiAs(Ge) grains contacting the semiconductor material are approximately 300 nm wide.

25. A method of forming an ohmic contact on a semiconductor material containing GaAs comprising the steps of:

(a) depositing a non-uniform layer of Au onto one surface of the semiconductor material;

(b) depositing a multi-layer ohmic contact of AuGeNi onto the non-uniform Au layer; and (c) alloying the ohmic contact to the semiconductor material thereby forming a two layer structure having a high density of large area NiAs(Ge) grains contacting the semiconductor material as a first layer and a AuGa phase as a top layer.

26. The method of claim 25 wherein the non-uniform layer of Au is deposited onto the semiconductor by sputter cleaning the semiconductor by using an Au-coated rf-electrode.

27. The method of claim 26 further including the step of depositing a layer of Ni onto the non-uniform layer of Au prior to the AuGeNi deposition.

* * * * *